United States Patent
Weilguni et al.

(10) Patent No.: US 11,076,475 B2
(45) Date of Patent: Jul. 27, 2021

(54) APPARATUS AND METHOD FOR GENERATING A NON-THERMAL ATMOSPHERIC PRESSURE PLASMA

(71) Applicant: TDK Electronics AG, Munich (DE)

(72) Inventors: Michael Weilguni, Hagenberg (AT); Pavol Kudela, Deutschlandsberg (AT)

(73) Assignee: TDK ELECTRONICS AG, Munich (DE)

(*) Notice: Subject to any disclaimer, the term of this patent is extended or adjusted under 35 U.S.C. 154(b) by 0 days.

(21) Appl. No.: 16/084,192

(22) PCT Filed: Jan. 25, 2017

(86) PCT No.: PCT/EP2017/051559
§ 371 (c)(1),
(2) Date: Sep. 11, 2018

(87) PCT Pub. No.: WO2017/153084
PCT Pub. Date: Sep. 14, 2017

(65) Prior Publication Data
US 2020/0187343 A1 Jun. 11, 2020

(30) Foreign Application Priority Data
Mar. 11, 2016 (DE) .......................... 102016104490.3

(51) Int. Cl.
*H05H 1/24* (2006.01)
*H01L 41/04* (2006.01)
*H01L 41/107* (2006.01)

(52) U.S. Cl.
CPC ......... *H05H 1/2475* (2013.01); *H01L 41/044* (2013.01); *H01L 41/107* (2013.01); *H05H 1/2481* (2021.05)

(58) Field of Classification Search
None
See application file for complete search history.

(56) References Cited

U.S. PATENT DOCUMENTS

| | | | | |
|---|---|---|---|---|
| 5,747,914 A | * | 5/1998 | Huang | H01L 41/044 310/318 |
| 7,755,254 B2 | * | 7/2010 | Kobayashi | H01L 41/29 310/328 |
| 7,821,762 B2 | * | 10/2010 | Yasuoka | H01T 23/00 361/212 |

(Continued)

FOREIGN PATENT DOCUMENTS

| CN | 1249068 A | 3/2000 |
|---|---|---|
| CN | 1551382 A | 12/2004 |

(Continued)

*Primary Examiner* — Amy Cohen Johnson
*Assistant Examiner* — Srinivas Sathiraju
(74) *Attorney, Agent, or Firm* — Slater Matsil, LLP

(57) ABSTRACT

An apparatus and a method for generating a non-thermal atmospheric pressure plasma are disclosed. In an embodiment, an apparatus for generating a non-thermal atmospheric-pressure plasma includes a first piezoelectric transformer, a second piezoelectric transformer, and a drive circuit configured to apply an input voltage to each of the piezoelectric transformers, and wherein the input voltage applied to the first transformer is phase-shifted by 90° in relation to the input voltage applied to the second transformer.

23 Claims, 5 Drawing Sheets

(56) References Cited

U.S. PATENT DOCUMENTS

| | | | |
|---|---|---|---|
| 7,886,690 B2* | 2/2011 | Ellingboe | H01J 37/32165 |
| | | | 118/723 E |
| 8,689,537 B1* | 4/2014 | Burton | H05H 1/54 |
| | | | 60/202 |
| 8,896,211 B2* | 11/2014 | Ish-Yamini Tomer | |
| | | | A61B 18/042 |
| | | | 315/111.21 |
| 9,788,404 B2* | 10/2017 | Nettesheim | H05H 1/24 |
| 10,029,025 B2* | 7/2018 | Nettesheim | A61L 2/14 |
| 10,624,197 B2* | 4/2020 | Weilguni | H01L 41/044 |
| 10,638,590 B2* | 4/2020 | Weilguni | H05H 1/2475 |
| 2002/0074903 A1* | 6/2002 | Phillips | H01L 41/107 |
| | | | 310/359 |
| 2004/0232806 A1* | 11/2004 | Nakatsuka | H01L 41/107 |
| | | | 310/359 |
| 2007/0159762 A1 | 7/2007 | Okano | |
| 2009/0122941 A1* | 5/2009 | Engemann | H05H 1/2475 |
| | | | 376/145 |
| 2015/0069911 A1* | 3/2015 | Nettesheim | B23K 10/00 |
| | | | 315/111.21 |
| 2017/0208675 A1* | 7/2017 | Doellgast | H01L 41/0533 |
| 2018/0287043 A1* | 10/2018 | Weilguni | H01L 41/044 |
| 2018/0375013 A1* | 12/2018 | Weilguni | H01L 41/107 |
| 2019/0051813 A1* | 2/2019 | Dollgast | H01L 41/257 |
| 2019/0098739 A1* | 3/2019 | Weilguni | H05H 1/2475 |
| 2020/0077502 A1* | 3/2020 | Weilguni | H01L 41/044 |
| 2020/0137865 A1* | 4/2020 | Pichler | H01L 41/053 |
| 2020/0137866 A1* | 4/2020 | Nettesheim | H01L 41/09 |

FOREIGN PATENT DOCUMENTS

| | | |
|---|---|---|
| CN | 101194338 A | 6/2008 |
| CN | 101442871 A | 5/2009 |
| CN | 105103319 A | 11/2015 |
| DE | 102005032890 A1 | 1/2007 |
| DE | 202008008980 U1 | 9/2008 |
| DE | 102008057423 A1 | 6/2009 |
| DE | 102014110405 A1 | 1/2016 |
| EP | 0831679 A1 | 3/1998 |
| EP | 1902599 B1 | 10/2011 |
| JP | 2000514250 A | 10/2000 |
| JP | 2001102195 A | 4/2001 |
| JP | 2005294178 A | 10/2005 |
| JP | 2008258509 A | 10/2008 |
| JP | 2009501409 A | 1/2009 |
| JP | 2010174272 A | 8/2010 |
| JP | 2015522901 A | 8/2015 |
| KR | 20110134217 A | 12/2011 |
| WO | 2009127297 A1 | 10/2009 |
| WO | WO2013069799 A1 | 5/2013 |

* cited by examiner

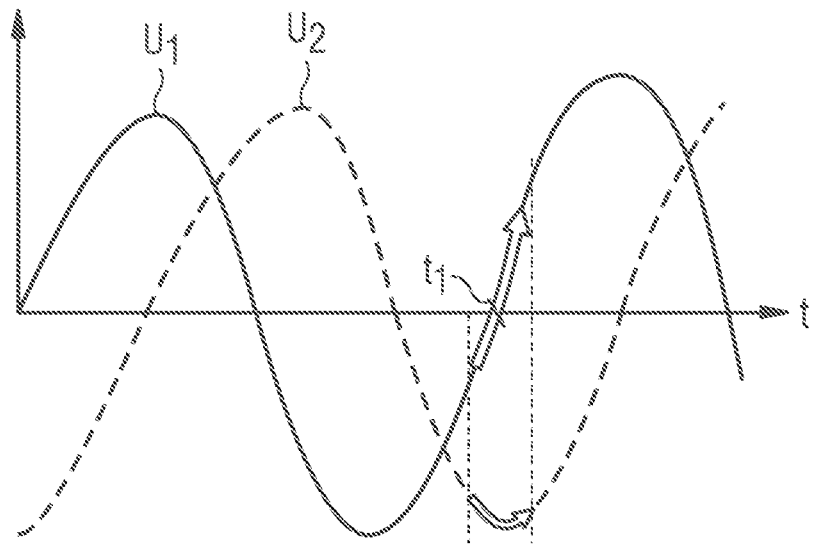
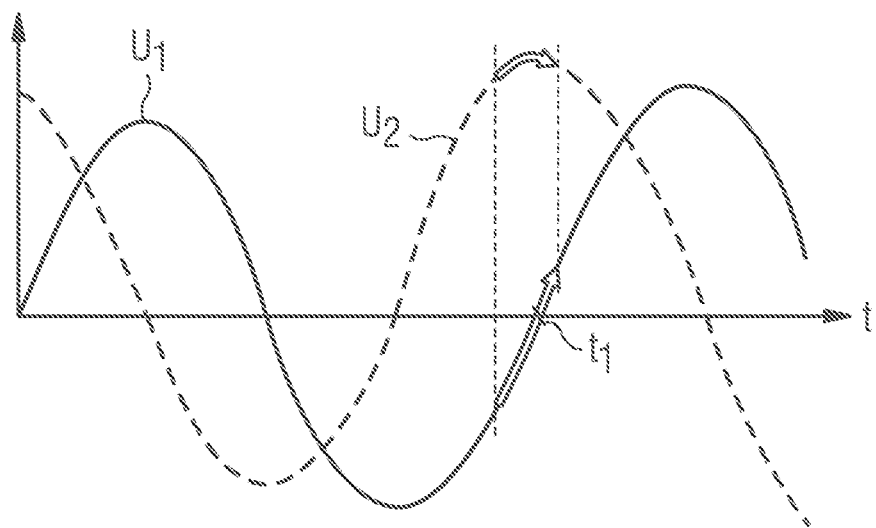

APPARATUS AND METHOD FOR GENERATING A NON-THERMAL ATMOSPHERIC PRESSURE PLASMA

This patent application is a national phase filing under section 371 of PCT/EP2017/051559, filed Jan. 25, 2017, which claims the priority of German patent application 10 2016 104 490.3, filed Mar. 11, 2016, each of which is incorporated herein by reference in its entirety.

TECHNICAL FIELD

The present invention relates to an apparatus for generating a non-thermal atmospheric-pressure plasma and to a method for plasma generation.

BACKGROUND

The apparatus comprises in particular a first and a second piezoelectric transformer, at whose output sides a high potential is generated that can be used for the ionization of a process gas. The volume on which the plasma generated by a piezoelectric transformer can act is in principle restricted to a region in front of the output side of the piezoelectric transformer. Processing a larger area is often necessary, in particular in industrial applications. A plurality of piezoelectric transformers arranged as closely as possible next to each other without this leading to a mutual impairment of the transformers should be accordingly used for this purpose.

Operating a plurality of piezoelectric transformers, arranged with a small distance from one another, with an input voltage phase-shifted through 180° is known from European Patent No. 1,902,599 B1. However it has been found here that a mutual extinguishing of the plasmas generated by the transformers is unavoidable.

SUMMARY OF THE INVENTION

Embodiments provide an improved apparatus for generating a non-thermal atmospheric-pressure plasma which allows a plurality of piezoelectric transformers to be arranged at a small distance from one another without this resulting in a mutual impairment of the transformers. Further embodiments provide an improved method for generating non-thermal atmospheric-pressure plasma.

According to an embodiment an apparatus for generating a non-thermal atmospheric-pressure plasma comprises a first piezoelectric transformer, a second piezoelectric transformer and a drive circuit. The drive circuit is configured to apply an input voltage to each of the piezoelectric transformers, wherein the input voltage that is applied to the first transformer is phase-shifted through 90° in relation to the input voltage that is applied to the second transformer.

The phase shift here is always stated relatively. The quotation of a phase shift of 90° can accordingly be considered as the magnitude of the phase shift, except when an explicit reference to a positive phase shift of +90° or a negative phase shift of −90° is made.

If both of the piezoelectric transformers are operated with an input voltage shifted through 90° with respect to one another, a plasma generation always occurs alternately at the first piezoelectric transformer and at the second piezoelectric transformer. In this way it is possible to avoid the two transformers generating plasma simultaneously, whereby the two plasma generations would impair one another. Through an alternating generation of the plasma with the first and the second transformer, an improved plasma generation rate can altogether be achieved.

The first and the second piezoelectric transformers can be arranged at a distance of less than 5 cm from one another. The small distance between the transformers is enabled in that the two transformers do not interfere with one another during the plasma generation. The two transformers should have a distance of at least 5 mm from one another.

The drive circuit can be configured in such a way that the input voltages that are applied to the piezoelectric transformers each have the same frequency. Otherwise, as a result of a differing frequency, the input voltages would move apart, so that a phase shift of 90° could not be maintained in continuous operation. A beat frequency and associated beat frequency effects would also result in that case. The formation of a beat frequency can be avoided in that the transformers are driven with the same frequency.

The transformers can be trimmed to the same length and thus the same resonant frequency by means of a grinding process. A frequency resulting from the mean value of the resonant frequencies of the piezoelectric transformers of the apparatus can alternatively be chosen for the drive of the transformers.

The apparatus can comprise further piezoelectric transformers, wherein the drive circuit can be configured to apply the input voltages to the transformers in such a way that input voltages that are present at immediately adjacent transformers are each phase-shifted through 90° with respect to one another.

Through the use of further piezoelectric transformers, it can be possible to treat a large area with the apparatus, wherein the area that can be treated simultaneously is increased through an increase in the number of piezoelectric transformers.

The piezoelectric transformers can be arranged parallel to one another and form a single row.

The piezoelectric transformers can be arranged parallel to one another and form an array with at least two rows and at least two columns. The drive circuit can be configured to apply the input voltages to the transformers in such a way that the input voltages that are present at the transformers that are arranged on one and the same diagonal of the array are each phase-shifted through 0° with respect to one another.

The first and the second piezoelectric transformers can be arranged in such a way that their output-side front faces are opposite one another. An object, for example a foil, that is to be treated can here be passed through a gap that is formed between the output-side front faces of the two transformers. Two mutually opposite surfaces of the object can accordingly be subjected simultaneously to plasma generated by the apparatus.

Alternatively or in addition, the apparatus can comprise a first group of piezoelectric transformers that comprises the first piezoelectric transformer and further piezoelectric transformers that are arranged parallel to one another and form a single row, and a second group of piezoelectric transformers that comprises the second piezoelectric transformer and further piezoelectric transformers that are arranged parallel to one another and form a single row. The first group of piezoelectric transformers and the second group of piezoelectric transformers can be arranged opposite one another, wherein the drive circuit is configured to apply the input voltages to each of the transformers of a row in such a way that input voltages that are present at immediately adjacent transformers are each phase-shifted through 90° with respect to one another, and that furthermore the input voltages that are present at transformers that are opposite one another are each phase-shifted through 90° with respect to one another.

Alternatively or in addition, the apparatus can comprise a first group of piezoelectric transformers that comprises the first piezoelectric transformer and further piezoelectric transformers that are arranged parallel to one another and form an array with at least two columns and at least two rows, and a second group of piezoelectric transformers that comprises the second piezoelectric transformer and further piezoelectric transformers that are arranged parallel to one another and form an array with at least two columns and at least two rows. The first group of piezoelectric transformers and the second group of piezoelectric transformers can be arranged opposite one another, wherein the drive circuit is configured to apply the input voltages to each of the transformers in such a way that input voltages that are present at immediately adjacent transformers are each phase-shifted through 90° with respect to one another, that the input voltages that are present at the transformers that are arranged on one and the same diagonal of the array are each phase-shifted through 0° with respect to one another, and that furthermore the input voltages that are present at transformers that are opposite one another are each phase-shifted through 90° with respect to one another.

According to a further aspect, embodiments of the present invention relates to a method for generating a non-thermal atmospheric-pressure plasma by at least one first piezoelectric transformer and by a second piezoelectric transformer, wherein an input voltage is applied to the first piezoelectric transformer and to the second piezoelectric transformer respectively that are phase-shifted through 90° with respect to one another.

The method can be carried out in particular with the apparatus described above. Accordingly, each functional and structural feature that was disclosed in connection with the apparatus can also be relevant to the method.

BRIEF DESCRIPTION OF THE DRAWINGS

The present invention is explained in more detail below with reference to the figures.

FIGS. 3 and 4 show the curve of the output voltage generated at the output-side front faces of the transformers;

DETAILED DESCRIPTION OF ILLUSTRATIVE EMBODIMENTS

Figure 1:
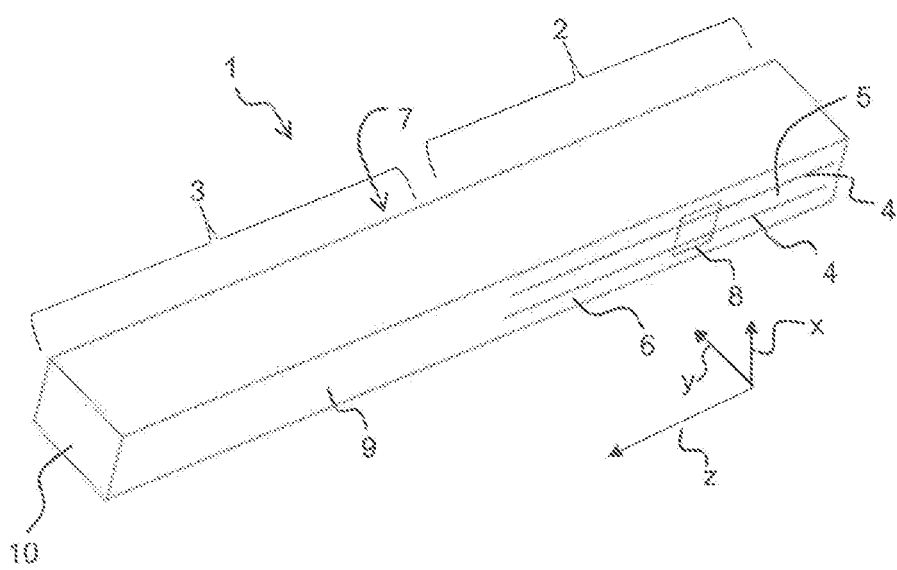
FIG. 1 shows a perspective view of a piezoelectric transformer.

FIG. 1 shows a perspective view of a piezoelectric transformer 1. The piezoelectric transformer 1 can be employed in particular in an apparatus for generating non-thermal atmospheric-pressure plasma.

A piezoelectric transformer 1 is a type of resonance transformer that is based on piezoelectricity and, in contrast to the conventional magnetic transformers, represents an electromechanical system. The piezoelectric transformer 1 is, for example, a Rosen transformer.

The piezoelectric transformer 1 comprises an input region 2 and an output region 3, wherein the output region 3 is connected to the input region 2 in a longitudinal direction z. In the input region 2 the piezoelectric transformer 1 comprises electrodes 4 to which an alternating voltage can be applied. The electrodes 4 extend in the longitudinal direction z of the piezoelectric transformer 1. The electrodes 4 are stacked alternately with a piezoelectric material 5 in a stacking direction x which is perpendicular to the longitudinal direction z. The piezoelectric material 5 is polarized here in the stacking direction x.

The electrodes 4 are arranged in the interior of the piezoelectric transformer 1, and are also referred to as inner electrodes. The piezoelectric transformer 1 comprises a first side face 6 and a second side face 7 that is located opposite to the first side face 6. A first outer electrode 8 is arranged on the first side face 6. A second outer electrode (not shown) is arranged on the second side face 7. The electrodes 4 located in the interior are connected electrically either to the first outer electrode 8 or to the second outer electrode, alternately in the stacking direction x.

The piezoelectric transformer 1 further comprises a third side face 20 and a fourth side face 21 that are arranged opposite to one another and perpendicular to the first side face 6 and the second side face 7. The normals to the surfaces of the third and fourth side faces 20, 21 point respectively in the stacking direction x.

The input region 2 can be driven with a low alternating voltage that is applied between the electrodes 4. The alternating voltage applied to the input side is first converted into a mechanical oscillation as a result of the piezoelectric effect. The frequency of the mechanical oscillation depends here primarily on the geometry and the mechanical construction of the piezoelectric transformer 1.

The output region 3 comprises piezoelectric material 9, and has no internal electrodes. The piezoelectric material 9 in the output region is polarized in the longitudinal direction z. The piezoelectric material 9 of the output region 3 can be the same material as the piezoelectric material 5 of the input region 2, wherein the piezoelectric materials 5 and 9 can differ in their polarization direction. In the output region 3, the piezoelectric material 9 is formed into a single, monolithic layer that is entirely polarized in the longitudinal direction z. The piezoelectric material 9 in the output region 3 here only has one, single polarization direction.

If an alternating voltage is applied to the electrodes 4 in the input region 2, a mechanical wave develops inside the piezoelectric material 5, 9, and generates an output voltage through the piezoelectric effect in the output region 3. The output region 3 comprises an output-side front face 10. An electric voltage is thus generated in the output region 3 between the front face 10 and the end of the electrodes 4 of the input region 2. A high voltage is generated here at the output-side front face 10. A high potential difference also arises here between the output-side front face and an environment of the piezoelectric transformer, which is sufficient to generate a strong electrical field that ionizes a process gas.

In this way the piezoelectric transformer 1 generates high electrical fields that are capable of ionizing gases or liquids through electrical excitation. Atoms or molecules of the respective gas or of the respective liquid are here ionized and form a plasma. An ionization always results when the electrical field strength at the surface of the piezoelectric transformer 1 exceeds the ignition field strength of the plasma. The field strength that is necessary for ionization of the atoms or molecules is referred to here as the ignition field strength of a plasma.

Figure 2A:
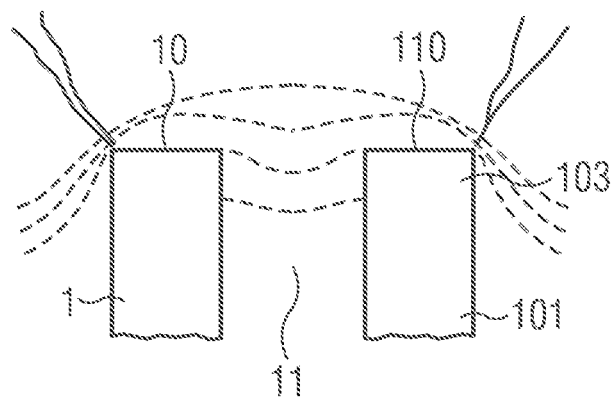
FIGS. 2A to 2C show a plasma generation with two piezoelectric transformers, wherein the input voltages that are applied to each of the transformers in the figures vary in their phase-shift with respect to one another.
Figure 2B:
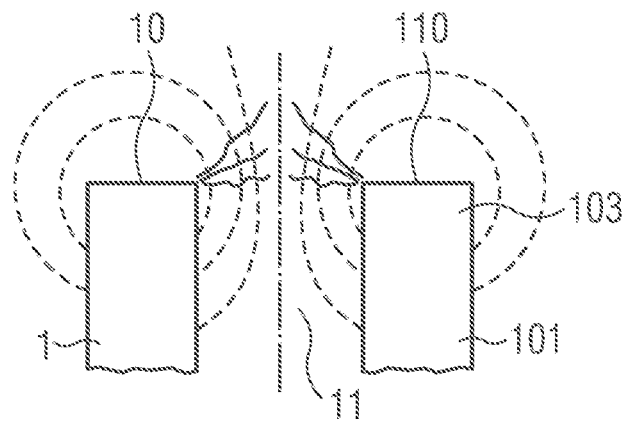
Figure 2C:
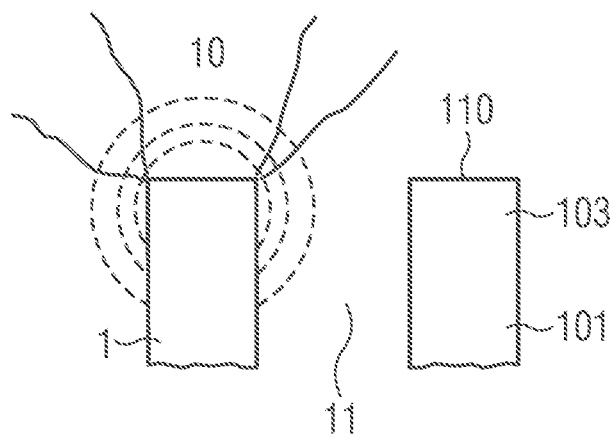

FIGS. 2A to 2C show schematically the plasma generation by means of an apparatus that comprises a first piezoelectric transformer 1 and a second piezoelectric transformer 101. The apparatus further comprises a drive circuit that makes it possible to apply an input voltage to each of the two transformers 1, 101.

The first transformer 1 and the second transformer 101 are arranged parallel to one another. In particular, the output region 3 of the first transformer 1 is arranged immediately adjacent to an output region 103 of the second transformer 101. The surface normals of the output-side front face 10 of the first transformer and an output-side front face 110 of the second transformer 101 are parallel to one another. There is a gap 11 between the first transformer 1 and the second transformer 101.

Through the use of a plurality of piezoelectric transformers 1, 101 in an apparatus for generating a non-thermal atmospheric-pressure plasma, it becomes possible to treat a larger area with a plasma at the same time. It is important for an efficient process design, in particular in industrial applications, that it is possible to subject large areas to non-thermal atmospheric-pressure plasma in a short processing time.

FIG. 2A shows an arrangement not in accordance with the invention, in which a respective input voltage is applied to the two transformers 1, 101, wherein the input voltage present at the first transformer 1 and the input voltage present at the second transformer 101 are not phase-shifted with respect to one another. A sinusoidal input voltage is applied here to each of the two transformers 1, 101. The temporal progression of the potential generated at the output-side front faces 10, 110 accordingly also follows a sinusoidal progression, wherein a maximum potential is generated at the two transformers 1, 101 at the same point in time.

The field pattern of the potentials generated by the two transformers 1, 101 is suggested in FIG. 2A by dashed lines. The dashed lines here are each equipotential lines.

FIG. 2A examines the potential progression at a point in time at which a maximum potential is generated at the two transformers 1, 101 at the respective output-side front face 10, 110. A potential progression results in which the potential in the gap 11 between the two transformers 1, 101 remains approximately constant. In contrast, a high field gradient develops at the edges of the output-side front faces 10, 110 that face away from the gap 11. The equipotential lines drawn with dashes here lie close to one another.

A high field gradient is necessary to ignite a plasma. The following situation accordingly results with in-phase drive of the two piezoelectric transformers 1, 101 with plasma generation: in the region of the gap 11, between the two transformers 1, 101, no plasma is ignited due to the equalization of the potential. A plasma ignition only results at the edges of the output-side front faces 10, 110 that face away from the gap 11, since it is only here that a sufficiently high field gradient is present.

The quantity of plasma that can be generated with this drive of the piezoelectric transformers 1, 101 is not much higher than the quantity of plasma achievable with a single piezoelectric transformer 1.

FIG. 2B shows a further drive of the two piezoelectric transformers 1, 101 not in accordance with the invention. A respective sinusoidal input voltage is applied here to each of the two piezoelectric transformers 1, 101 and said voltages are phase-shifted through 180° with respect to one another.

A maximum positive potential is accordingly present at the output-side front face 10 of the first piezoelectric transformer 1 when at the same point in time a maximum negative potential is present at the output-side front face 110 of the second piezoelectric transformer 101.

In this case a high field gradient develops, in particular in the gap 11 between the two piezoelectric transformers 1, 101. A plasma ignition accordingly results at the first piezoelectric transformer 1 at which a plasma beam is generated that is aimed strongly at the second piezoelectric transformer 101. At the second piezoelectric transformer 101 a plasma ignition results, in which a plasma beam is generated that is aimed strongly at the first piezoelectric transformer 1.

A lower field gradient in comparison with the gap 11 develops at the edges of the output-side front faces 10, 110 that face away from the gap 11. A plasma ignition therefore does not result at these edges. The plasma quantity generated in this case therefore is on the whole not significantly greater than the quantity of plasma that can be generated in the same time with a single piezoelectric transformer 1.

FIG. 2C now examines a drive in which an input voltage is applied to the first piezoelectric transformer 1 that is phase-shifted through 90° with respect to an input voltage that is applied to the second piezoelectric transformer 101. The two input voltages each have a sinusoidal progression.

In this case the potential generated at the output-side front face 10 of the first piezoelectric transformer 1 reaches its maximum when the second piezoelectric transformer 101 is essentially without field. Accordingly the plasma generation through the first piezoelectric transformer 1 is not significantly influenced by the second piezoelectric transformer 101.

The potential generated at the output-side front face 110 of the second piezoelectric transformer 101 furthermore reaches a maximum when the first piezoelectric transformer 1 is essentially without field. Accordingly the plasma generation through the second piezoelectric transformer 101 is also not significantly influenced by the first piezoelectric transformer 1.

The configuration described in FIG. 2C accordingly leads to a plasma generation rate that is significantly greater than a plasma generation rate that can be achieved with a single piezoelectric transformer 1. The generated plasma, furthermore, is generated in a direction to the front, distributed evenly over a large solid angle.

FIG. 3 shows the temporal progression of the potential generated at the output-side front face 10 of the first piezoelectric transformer 1, and of the potential generated at the output-side front face 110 of the second piezoelectric transformer 101. The curve $U_1$ here shows the temporal progression of the potential generated at the output-side front face 10 of the first piezoelectric transformer 1, and the curve $U_2$ correspondingly shows the temporal progression of the potential generated at the output-side front face 110 of the second piezoelectric transformer 101. The input voltage applied to the second piezoelectric transformer 101 is phase-shifted through +90° with respect to the input voltage applied to the first piezoelectric transformer 1.

Plasma and ozone can be generated by the piezoelectric transformer 1 through a dielectric barrier discharge (DBD). The plasma generation resulting from a dielectric barrier discharge depends to a large extent on the rate of change of the potentials generated at the output-side front face 10, 110. If now, as is indicated in FIG. 3, the potentials generated at two immediately adjacent piezoelectric transformers 1, 101 are shifted through 90° with respect to one another, then the potentials each exhibit a maximum rate of change in alternation.

The curve $U_1$, for example, exhibits a maximum rate of rise at point in time $t_1$. The curve $U_2$ on the other hand exhibits only a minimal change at point in time $t_1$. At point in time $t_1$ a plasma is accordingly ignited at the first piezoelectric transformer 1 while no plasma is ignited at the second piezoelectric transformer 101. Since as a result the two transformers 1, 101 always generate plasma in alternation with one another, they do not mutually interfere with the plasma generation.

FIG. 4 also shows the progression of the potentials generated at the output-side front faces 10, 110 of the first and the second piezoelectric transformers 1, 101, wherein now the input voltage of the second piezoelectric transformer 101 is phase-shifted through −90° with respect to the input voltage of the first piezoelectric transformer 1. The configuration already explained in FIG. 3 again develops, in which the two transformers 1, 101 always generate plasma in alternation with one another, since they each then achieve a maximum rate of rise of the output-side potentials when the respective other transformer 1, 101 exhibits an almost constant potential.

A drive offset through 90° of the two transformers 1, 101 thus permits an optimization both of the geometric field gradients and also of the temporal progression of the rate of change of the fields generated in such a way that the plasma quantity generated by the two transformers 1, 101 can be maximized.

Figure 5:
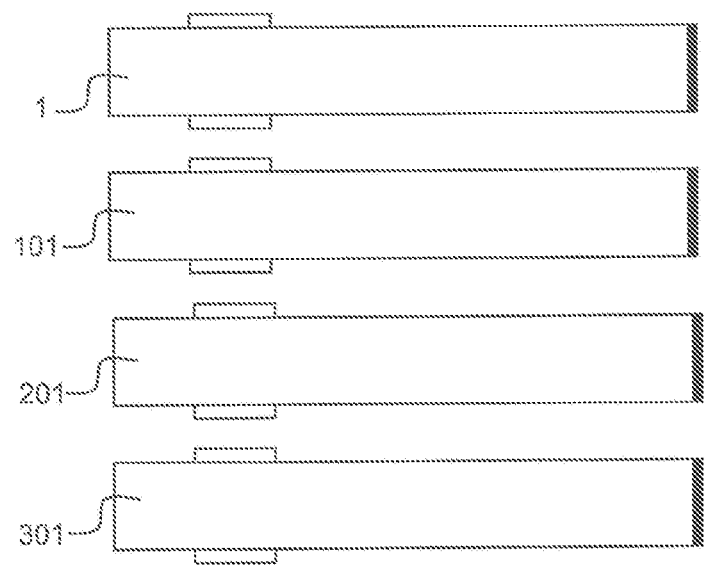
FIG. 5 shows an apparatus for plasma generation in which piezoelectric transformers are arranged in a single row.

FIG. 5 shows an apparatus for generating a non-thermal atmospheric-pressure plasma that comprises, in addition to the first piezoelectric transformer 1 and the second piezoelectric transformer 101, a third transformer 201 and a fourth transformer 301. The apparatus can, furthermore, comprise yet more piezoelectric transformers. The piezoelectric transformers 1, 101, 201, 301 are here arranged in parallel with one another. The surface normals of the output-side front faces of the piezoelectric transformers are parallel to one another.

The piezoelectric transformers 1, 101, 201, 301 are furthermore arranged with a small spacing from one another. The piezoelectric transformers 1, 101, 201, 301 can be arranged with a spacing of more than 5 mm and less than 5 cm from one another. The piezoelectric transformers 1, 101, 201, 301 are arranged in such a way that they form a row. This arrangement of piezoelectric transformers 1, 101, 201, 301 in a single row makes it possible, for example, to subject foils on assembly lines to plasma effectively.

The first transformer 1 is immediately adjacent to the second transformer 101. The second transformer 101 is immediately adjacent to the first transformer 1 and to the third transformer 201, etc.

The apparatus further comprises a drive circuit that applies an input voltage to each of the piezoelectric transformers 1, 101, 201, 301. The input voltages are applied here in such a way that input voltages are applied to respectively adjacent piezoelectric transformers that are each phase-shifted through 90° with respect to one another.

A drive of the first through to a fourth piezoelectric transformer 1, 101, 201, 301 is now considered as an example.

According to a first exemplary embodiment, the drive circuit could apply an identical input voltage to the first and the third piezoelectric transformers 1, 201 respectively, which means apply input voltages that are not phase-shifted with respect to one another, and apply an input voltage that is phase-shifted through 90° with respect to the input voltage present at the first and third transformers 1, 101 to the second and fourth piezoelectric transformers 101, 301 respectively.

According to a second exemplary embodiment, the input voltage of the first transformer 1 has a phase shift of 0°, the input voltages of the second transformer 101 and of the fourth transformer 301 each have a phase shift of +90°, and the input voltage of the third transformer 201 has a phase shift of +180°. Further possible phase shifts of the input voltages applied to the first through to the fourth piezoelectric transformer 1, 101, 201, 301 can be taken from the table below. The phase shifts are always to be considered here relative to one another. All permutations with positive and negative arithmetic signs, as well as phase shifts through n°, are accordingly also possible.

| | First transformer | Second transformer | Third transformer | Fourth transformer |
|---|---|---|---|---|
| Example 1 | 0° | +90° | 0° | +90° |
| Example 2 | 0° | +90° | +180° | +90° |
| Example 3 | 0° | +90° | 0° | −90° |
| Example 4 | 0° | +90° | +180° | +270° |

The respective phase shifts of the input voltages applied to the first through to the fourth piezoelectric transformer 1, 101, 201, 301 are listed in the table. The phase shifts are always to be considered here relative to one another. All permutations with positive and negative arithmetic signs are accordingly also possible. All shifts wherein all the phase shifts are shifted through an arbitrary quantity n° are furthermore included.

Figure 6:
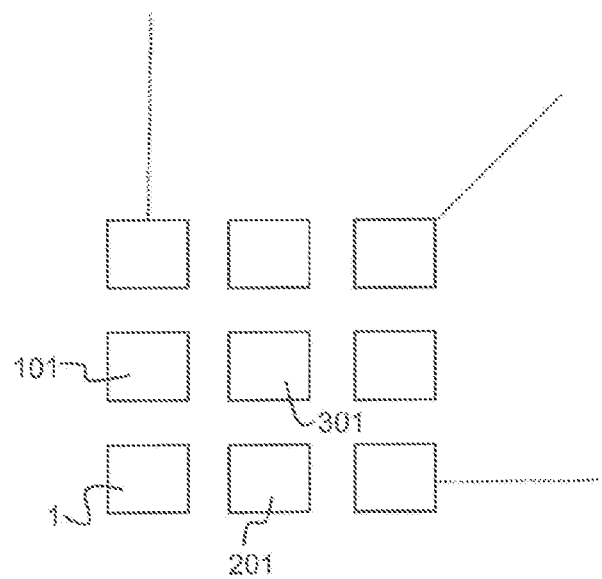
FIG. 6 shows an array of piezoelectric transformers.

FIG. 6 shows a further exemplary embodiment of the apparatus. The output-side front faces 10, 110 of the piezoelectric transformers 1, 101, 201, 301 of the apparatus are shown here in plan view. The piezoelectric transformers are arranged parallel to one another, and form an array 1, 101, 201, 301 that comprises a plurality of rows and a plurality of columns. The first and the third transformers 1, 201 are, for example, arranged in one row. The first and the second transformers 1, 101 are arranged in one column. The first and the fourth transformers 1, 301 are arranged along the same diagonal. The second and the third transformers 101, 201 are also arranged along the same diagonal.

The transformers 1, 101, 201, 301 are driven in such a way that piezoelectric transformers 1, 101 that are immediately adjacent are respectively supplied with input voltages that are phase-shifted through 90° with respect to one another. The piezoelectric transformers 1, 301 or 101, 201 that are located on one diagonal are respectively supplied with input voltages that are not phase-shifted with respect to one another. The ignition of plasma along the diagonals can be prevented by this.

Figure 7:
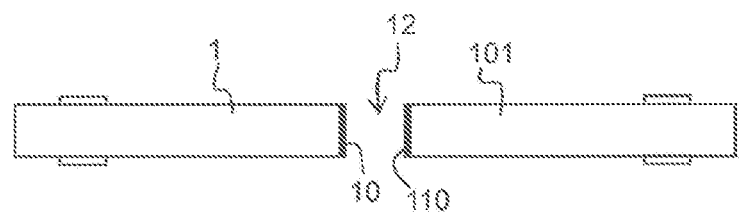
FIG. 7 shows an apparatus for plasma generation in which the piezoelectric transformers lie opposite one another.

FIG. 7 shows a further exemplary embodiment of an apparatus for generating a non-thermal atmospheric-pressure plasma. The first piezoelectric transformer 1 and the second piezoelectric transformer 101 are here arranged opposite one another. The output-side front face 10 of the first piezoelectric transformer 1 in particular faces towards the output-side front face 110 of the second piezoelectric transformer 101.

In this case again, the two piezoelectric transformers 1, 101 are supplied by a drive circuit with an input voltage of such a nature that the input voltage present at the first piezoelectric transformer 1 is phase-shifted through 90° with respect to the input voltage present at the second piezoelectric transformer 101 through 90°.

The apparatus shown in FIG. 7 is in particular suitable for treating two sides of a foil with plasma simultaneously. The foil can here be passed through an intermediate space 12 formed between the two output-side front faces 10, 110 of the piezoelectric transformers 1, 101. An upper side of the foil can here face towards the first piezoelectric transformer 1, and a lower side of the foil can face the second piezoelectric transformer 101. The first piezoelectric transformer 1 generates a plasma with which the upper side of the foil is treated, and the second piezoelectric transformer 101 generates a plasma with which the lower side of the foil is treated with plasma.

The exemplary embodiments shown in FIG. 5 and FIG. 6 in which the piezoelectric transformers 1 are arranged to form a single row or an array comprising a plurality of columns and a plurality of rows, can be implemented in an opposite-facing arrangement. A first group of piezoelectric transformers can here form either a row or an array and be arranged opposite to a second group of piezoelectric transformers which also form a row or an array. The transformers are here supplied with an input voltage, wherein it should be noted that transformers that are immediately adjacent to one another should each be supplied with an input voltage mutually offset by 90°, that transformers facing each other as opposites should also be supplied with an input voltage that is mutually offset by 90°, and that the transformers that are arranged on a diagonal are each supplied with input voltages of the same phase.

The invention claimed is:

1. An apparatus for generating a non-thermal atmospheric-pressure plasma comprising:
a first piezoelectric transformer;
a second piezoelectric transformer; and
a drive circuit configured to apply an input voltage to the first piezoelectric transformer and a second input voltage to the second piezoelectric transformer,
wherein the input voltage applied to the first piezoelectric transformer is phase-shifted by 90° in relation to the input voltage applied to the second piezoelectric transformer, and
wherein a frequency resulting from a mean value of resonant frequencies of the first and second piezoelectric transformers is chosen for the drive circuit.

2. The apparatus according to claim 1, wherein the first and second piezoelectric transformers are arranged at a distance of less than 5 cm from one another.

3. The apparatus according to claim 1, wherein the drive circuit is configured in such a way that both input voltages have the same frequency.

4. The apparatus according to claim 1, wherein the apparatus comprises more than two piezoelectric transformers, and wherein the drive circuit is configured to apply input voltages to the piezoelectric transformers in such a way that the input voltages of immediately adjacent piezoelectric transformers are each phase-shifted by 90° with respect to one another.

5. The apparatus according to claim 4, wherein the piezoelectric transformers are arranged parallel to one another and form a single row.

6. The apparatus according to claim 4, wherein the piezoelectric transformers are arranged parallel to one another and form an array with at least two rows and at least two columns, and wherein the drive circuit is configured to apply the input voltages to the piezoelectric transformers in such a way that the input voltages at the piezoelectric transformers that are arranged on one and the same diagonal of the array are each phase-shifted by 0° with respect to one another.

7. The apparatus according to claim 1, wherein the first and the second piezoelectric transformers are arranged in such a way that their output-side front faces are opposite one another.

8. The apparatus according to claim 1, wherein a first group of piezoelectric transformers comprises the first piezoelectric transformer and further first piezoelectric transformers that are arranged parallel to one another and form a single row, wherein a second group of piezoelectric transformers comprises the second piezoelectric transformer and further second piezoelectric transformers that are arranged parallel to one another and form a single row, wherein the first group of piezoelectric transformers and the second group of piezoelectric transformers are arranged opposite one another, and wherein the drive circuit is configured to apply the input voltages to each of the piezoelectric transformers of a row in such a way that the input voltages at immediately adjacent piezoelectric transformers are each phase-shifted by 90° with respect to one another, and that the input voltages at piezoelectric transformers that are opposite one another are each phase-shifted by 90° with respect to one another.

9. The apparatus according to claim 1, wherein a first group of piezoelectric transformers comprises the first piezoelectric transformer and further first piezoelectric transformers that are arranged parallel to one another and form an array with at least two columns and at least two rows, wherein a second group of piezoelectric transformers comprises the second piezoelectric transformer and further second piezoelectric transformers that are arranged parallel to one another and form an array with at least two columns and at least two rows, wherein the first group of piezoelectric transformers and the second group of piezoelectric transformers are arranged opposite one another, and wherein the drive circuit is configured to apply the input voltages to each of the piezoelectric transformers in such a way that input voltages at immediately adjacent piezoelectric transformers are each phase-shifted by 90° with respect to one another, that the input voltages at the piezoelectric transformers that are arranged on one and the same diagonal of the array are each phase-shifted through 0° with respect to one another, and that the input voltages at piezoelectric transformers that are opposite one another are each phase-shifted through 90° with respect to one another.

10. The apparatus according to claim 1, wherein the first piezoelectric transformer and the second piezoelectric transformer are spaced apart by a gap.

11. A method for generating a non-thermal atmospheric-pressure plasma, the method comprising:
applying a first input voltage to at least one first piezoelectric transformer; and
applying a second input voltage to a second piezoelectric transformer,
wherein the first input voltage is phase-shifted by 90° with respect to the second input voltage, and
wherein a frequency resulting from a mean value of resonant frequencies of the first and second piezoelectric transformers is chosen for a drive circuit driving the first and second piezoelectric transformers.

12. An apparatus for generating a non-thermal atmospheric-pressure plasma comprising:
a first piezoelectric transformer;
a second piezoelectric transformer; and a drive circuit configured to apply an input voltage to each of the piezoelectric transformers, wherein the input voltage applied to the first piezoelectric transformer is phase-shifted by 90° in relation to the input voltage applied to the second piezoelectric transformer, and wherein the first and the second piezoelectric transformers are arranged in such a way that their output-side front faces are opposite one another, wherein the first piezoelectric transformer and the second piezoelectric transformer are spaced apart by a gap and the gap is present between the output-side front faces of the two transformers.

13. The apparatus according to claim 12, wherein the first and the second piezoelectric transformers are arranged at a distance of less than 5 cm from one another.

14. The apparatus according to claim 12, wherein the drive circuit is configured in such a way that both input voltages have the same frequency.

15. The apparatus according to claim 12, wherein the apparatus comprises more than two piezoelectric transformers, and wherein the drive circuit is configured to apply input voltages to the piezoelectric transformers in such a way that the input voltages of immediately adjacent piezoelectric transformers are each phase-shifted by 90° with respect to one another.

16. The apparatus according to claim 15, wherein the piezoelectric transformers are arranged parallel to one another and form a single row.

17. The apparatus according to claim 15, wherein the piezoelectric transformers are arranged parallel to one another and form an array with at least two rows and at least two columns, and wherein the drive circuit is configured to apply the input voltages to the piezoelectric transformers in such a way that the input voltages at the piezoelectric transformers that are arranged on one and the same diagonal of the array are each phase-shifted by 0° with respect to one another.

18. The apparatus according to claim 12, wherein a first group of piezoelectric transformers comprises the first piezoelectric transformer and further first piezoelectric transformers that are arranged parallel to one another and form a single row, wherein a second group of piezoelectric transformers comprises the second piezoelectric transformer and further second piezoelectric transformers that are arranged parallel to one another and form a single row, wherein the first group of piezoelectric transformers and the second group of piezoelectric transformers are arranged opposite one another, and wherein the drive circuit is configured to apply the input voltages to each of the piezoelectric transformers of a row in such a way that the input voltages at immediately adjacent piezoelectric transformers are each phase-shifted by 90° with respect to one another, and that the input voltages at piezoelectric transformers that are opposite one another are each phase-shifted by 90° with respect to one another.

19. The apparatus according to claim 12, wherein a first group of piezoelectric transformers comprises the first piezoelectric transformer and further first piezoelectric transformers that are arranged parallel to one another and form an array with at least two columns and at least two rows, wherein a second group of piezoelectric transformers comprises the second piezoelectric transformer and further second piezoelectric transformers that are arranged parallel to one another and form an array with at least two columns and at least two rows, wherein the first group of piezoelectric transformers and the second group of piezoelectric transformers are arranged opposite one another, and wherein the drive circuit is configured to apply the input voltages to each of the piezoelectric transformers in such a way that input voltages at immediately adjacent piezoelectric transformers are each phase-shifted by 90° with respect to one another, that the input voltages at the piezoelectric transformers that are arranged on one and the same diagonal of the array are each phase-shifted through 0° with respect to one another, and that the input voltages at piezoelectric transformers that are opposite one another are each phase-shifted through 90° with respect to one another.

20. The apparatus according to claim 12,
wherein the apparatus is configured to treat an object by the non-thermal atmospheric-pressure plasma when passing through the gap, and
wherein two mutually opposite surfaces of the object are subjected simultaneously to plasma generated by the apparatus.

21. The apparatus according to claim 20, wherein the object is a foil.

22. A method for generating a non-thermal atmospheric-pressure plasma, the method comprising:
applying a first input voltage to at least one first piezoelectric transformer; and
applying a second input voltage to a second piezoelectric transformer,
wherein the first input voltage is phase-shifted by 90° with respect to the second input voltage, and
wherein the first piezoelectric transformer and the second piezoelectric transformer are spaced apart by a gap and the gap is formed between an output-side front face of the first piezoelectric transformer and an output-side front face of the second piezoelectric transformer; and
passing an object through the gap; and
simultaneously subjecting two mutually opposite surfaces of the object to plasma.

23. The method according to claim 22, wherein the object is a foil.

* * * * *